United States Patent
Giles et al.

[11] Patent Number: 5,812,561
[45] Date of Patent: Sep. 22, 1998

[54] SCAN BASED TESTING OF AN INTEGRATED CIRCUIT FOR COMPLIANCE WITH TIMING SPECIFICATIONS

[75] Inventors: Grady L. Giles; Alfred Larry Crouch; Odis Dale Amason, Jr.; Matthew Donald Pressly; Clark Gilson Shepard; Michael Alan Mateja, all of Austin; Lee Allen Corley, Buda; Daniel T. Marquette, Austin; Jason E. Doege, Austin, all of Tex.

[73] Assignee: Motorola, Inc., Schaumburg, Ill.

[21] Appl. No.: 707,272

[22] Filed: Sep. 3, 1996

[51] Int. Cl.$^6$ .................................................. G01R 31/28
[52] U.S. Cl. .................................. 371/22.31; 395/182.06
[58] Field of Search ........................... 371/22.31, 22.32, 371/22.34, 22.36, 22.5, 25.1, 27.7, 27.4; 364/488, 489, 578; 395/183.06, 183.09, 183.19, 500, 550, 182.06; 324/73.1

[56] References Cited

U.S. PATENT DOCUMENTS

| | | | |
|---|---|---|---|
| 5,132,974 | 7/1992 | Rosales | 371/22.3 |
| 5,260,949 | 11/1993 | Hashizume et al. | 371/22.3 |
| 5,467,354 | 11/1995 | Yamauchi | 371/22.3 |
| 5,526,365 | 6/1996 | Whetsel | 371/22.3 |
| 5,535,223 | 7/1996 | Horstmann et al. | 371/27 |
| 5,592,493 | 1/1997 | Crouch et al. | 371/22.3 |
| 5,604,432 | 2/1997 | Moore et al. | 324/158.1 |
| 5,633,879 | 5/1997 | Potts et al. | 371/27 |

OTHER PUBLICATIONS

Test Compiler™ and Test Compiler Plus™ Ref.Manual, Version 3.0,Dec. 1992 pub. by Synopsys, Inc., "I/O Port Requirements for Scan Implementation Styles", pp. 3–16–5–29.

Edward J. McCluskey, "Logic Design Principles" with emphasis on Testable Semicustom Circuits, pub. by Prentice Prentice Hall 1985, pp. 434–440.

Miron Abramovici et al, "Digital Systems Testing and Testable Design", pub. by AT&T Bell Labs & W.H. Freeman and Co., 9 ppgs.

"DFT Advisory Reference Manual, Software Version $8.5_{13}$ 5," Mentor Graphics Corporation, Wilsonville, Oregon, 1991–1997, pp. 2–321–2–322.

*Primary Examiner*—Robert W. Beausoliel, Jr.
*Assistant Examiner*—Nadeem Iqbal
*Attorney, Agent, or Firm*—Daniel D. Hill

[57] ABSTRACT

A method and implementation for providing an improved testable design for an integrated circuit (IC) device. The integrated circuit includes a functional path for the implementation of a functional specification as well as a testing path for testing the timing specifications for the integrated circuit. Input switching devices are connected between input terminals of the IC and inputs to sequential circuit elements, for example flip-flop devices, in the IC. Similarly, output switching devices are connected between outputs of the flip-flop devices and output terminals of the IC. The switching devices are selectively operable to alternately connect the flip-flop devices into either a functional IC path for providing functional output signals during functional cycles, or into a testing IC path for providing testing output signals indicative of timing points throughout the IC during testing cycles. The IC is also operable to selectively disable tristate bus drivers during the testing cycles. The switching devices are arranged such that a single output terminal of the IC may be selectively used to provide both functional and testing output signals.

22 Claims, 8 Drawing Sheets

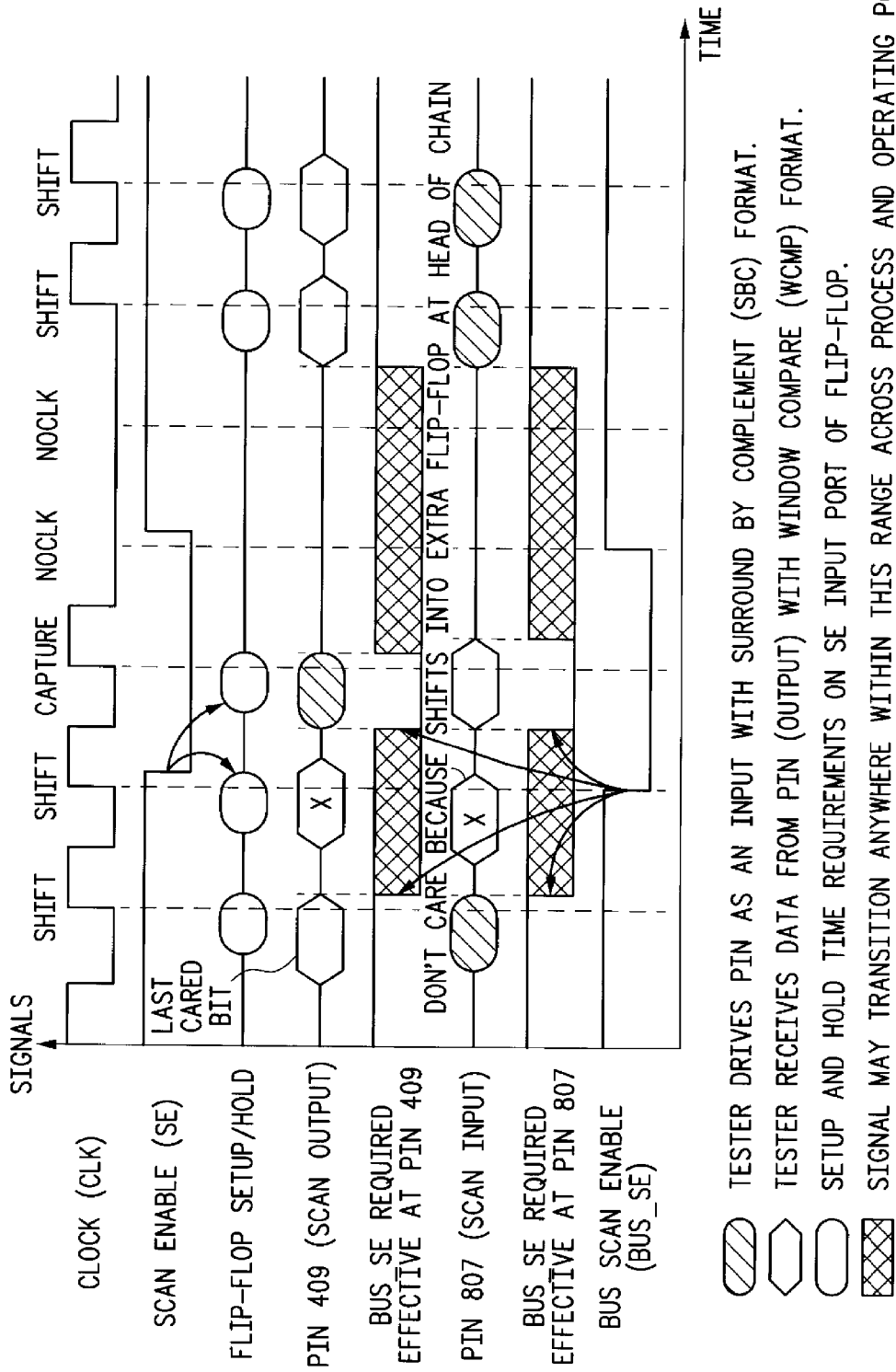

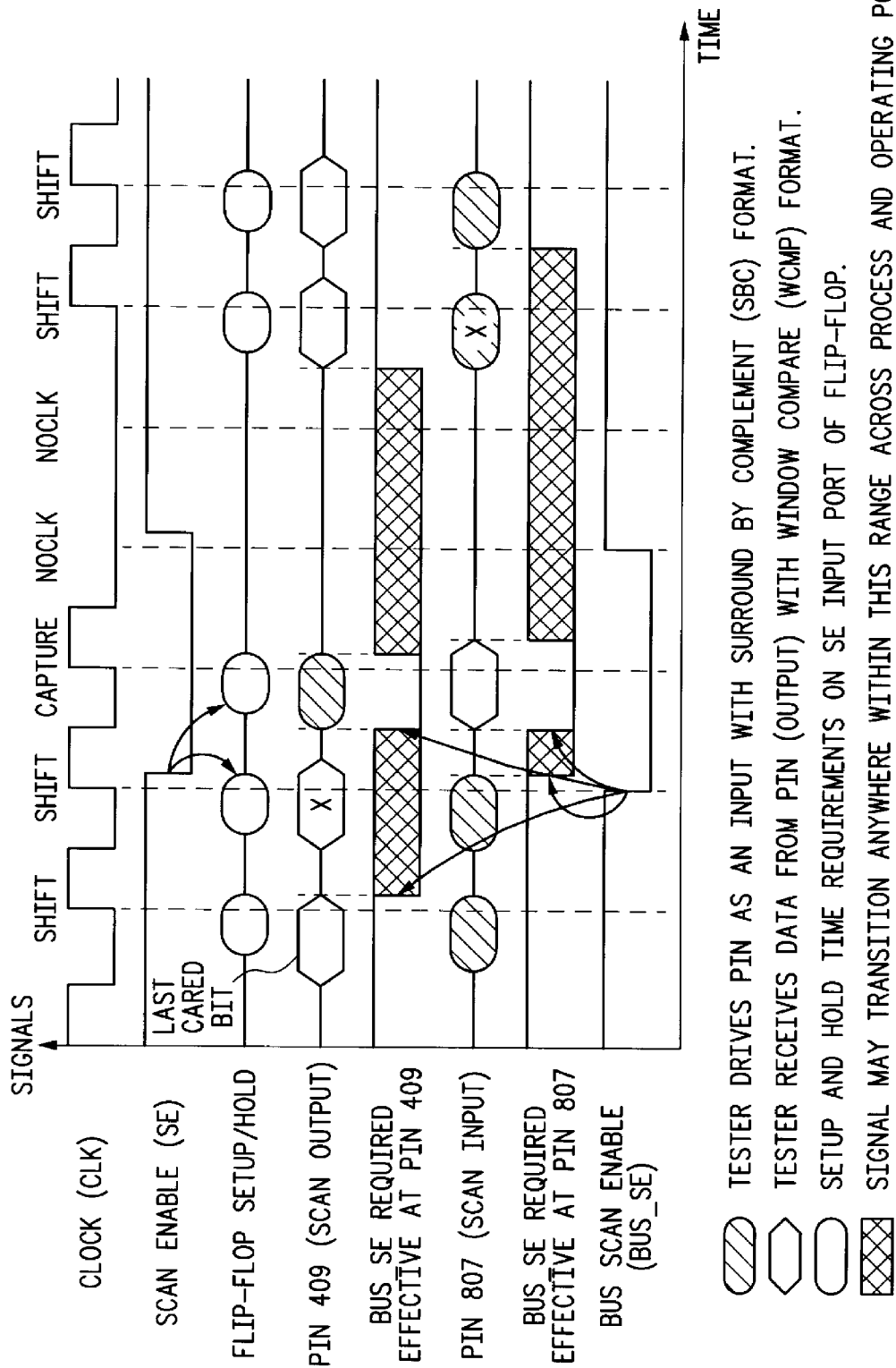

SCAN BASED TESTING OF AN INTEGRATED CIRCUIT FOR COMPLIANCE WITH TIMING SPECIFICATIONS

FIELD OF THE INVENTION

The present invention relates generally to integrated circuit design and testing, and more particularly to an improved method and apparatus for providing scan based testing for integrated circuits.

BACKGROUND OF THE INVENTION

In the design and manufacture of integrated circuits or chips, there are many functional and manufacturing specification requirements that must be addressed and satisfied. In the design phase, the use of computer-based design systems, and the success of computer aided design (CAD) and computer aided engineering (CAE) programs, has resulted in an increase in the number and kinds of computer programs being applied to accomplish integrated circuit or "chip" design tasks. Since such integrated circuits may contain millions of transistors, and each integrated circuit or chip must be tested to meet certain specifications, it is apparent that the design and testing of such circuits, even with the benefit of CAD and CAE programs, takes substantial amounts of time for both the design process as well as the testing process. Moreover, the equipment required to accomplish the testing phase is of considerable expense and such resources are therefore limited. Accordingly, in many cases, even after an integrated circuit has been designed and verified from a functional aspect, the testing of integrated circuit parts becomes a bottleneck in the system and consumes an inordinate amount of time. Therefore, when the amount of time required for each part to be tested is minimized, more parts can be tested per unit time and the efficiency of the testing process substantially improved.

In general, integrated circuits must meet a plurality of design and manufacturing specifications and budgeted allowances including, for example, (1) an overall functional specification of the chip describing the logical functions or required actions of the final product; (2) a budget for the overall die size measured in chip area (also referred to as "real estate"); (3) a budget for the AC switching characteristics measured in signal propagation delay or clock signal frequency; (4) a budget for manufacturing requirements measured by cost, packaging complexity, and the ability to manufacture the final chip; and (5) budgets for quality assurance and testability which are measured by such indicators as fault coverage, defect density, defects per million, defects in time, and the results of the verification and testing process. The accomplishment of the necessary testing and verification in a minimal amount of time will enable delivery of a final high quality and comprehensively tested part in the shortest possible time period.

CAD/CAE methodology for chip design has evolved into a series of broadly prescribed processing functions which process design data and produce a final chip design. However, since microprocessor or other chips are so extensive in terms of millions of transistors and connections, even with the help of CAD/CAE design tools, the processing at many of the design steps may take days or even weeks just to run design rule or specification compliance check programs. In some cases, even after the successful design and testing of a design prototype netlist, a manufactured chip or device may fail to meet functional or frequency specifications during a verification process for one of many possible reasons, and the design, manufacturing and testing process must be re-initiated. Moreover, since the testing and verification processes require the use of relatively few and expensive testing stations, a flow bottleneck in the design and manufacturing process frequently results. Accordingly, there is a continuing effort in the industry to find new methods of shortening this testing process without sacrificing product quality assurance.

The cost of testing a device can be very expensive. This cost can establish the lower limit of pricing of semiconductor devices. The customer or end user of the device also expects a certain quality level. Reporting to this quality level involves measurement of the functionality, defect level and frequency or timing specification of the device. The current method of accomplishing this is with functional or operational vectors which are not cost effective when used in a manufacturing test program since there is a low "fault coverage to clock cycle" ratio. One method used to reduce the cost of test is to base testing on more efficient "scan vectors".

Scan testing is a process by which individual manufactured parts may be tested for compliance with structural and certain design-related specifications by using portions of the designed chip itself. After testing, those portions are multiplexed or switched out of the circuit and the chip assumes its functional duties in connection with the functional design and application of the manufactured part or chip. This multi-purpose or multiplexed use of manufactured parts has greatly reduced part specification verification and testing time in the chip manufacturing process. However, even with the use of scan testing, new and improved methods to reduce test time for manufactured chips are still highly desired.

Moreover, scan vectors are used for defect level testing and must still be augmented with functional vectors to achieve operational frequency verification. This is because there are problems with functional verification due to the application of scan control signals and the scan sequence. Scan operation has, in the past, used control signals to fix certain pins and signals so that they are always at one value. For example, a bidirectional data bus may be held to be "input only" or "output only" during scan test mode. This would disallow testing of the timing specification on those pins since they are being artificially controlled during the test mode. In order to test functional specifications with a scan test mode, the device must be in an almost "functional" state since the shifting of the scan data requires "SET" and "CLR" signals, as well as tristate and other asynchronous actions. This functional state does not exist during current state-of-the-art scan processing. Note that the term "pin" as used throughout this document is being used to represent any type of terminal or conductor that is used to couple an integrated circuit to the outside world.

One aspect of the verification process involves so called "AC" testing. AC testing includes frequency verification and pin specifications. Frequency verification includes testing for the time required for register-to-register transfers, cache accesses and input/output accesses. Pin specification testing involves testing for input set-up time, input hold time, output valid time, as well as output tristate and output hold times. Note that the term "tristate" as used throughout this document interchangeably with the term "high impedance". Functional vectors have been required to do AC testing for MUXed "D" flip-flop type of scan. Functional vectors are not "test-program" efficient. Such vectors are large in size and provide less fault coverage per clock cycle (more comprehensive testing requires more clock cycles and thus more time). Some scan techniques use scan mode "forced" signals that artificially place or force a chip into a test state which blocks or invalidates real paths within the chip, thereby preventing real path testing until the forced state is removed.

Thus, there is a need for an integrated circuit testing and verification method and apparatus which improves fault test coverage and also reduces the testing time required for manufactured integrated circuit parts.

BRIEF DESCRIPTION OF THE DRAWINGS

A better understanding of the present invention can be obtained when the following detailed description of a preferred embodiment is considered in conjunction with the following drawings, in which:

FIG. 9 is a timing diagram illustrating the usage of NOCLK vectors and extra flip-flops at the head of scan chains; and FIG. 10 is a timing diagram illustrating the skewing of scanin data by one cycle relative to scan-out data in addition to the usage of NOCLK vectors.

DESCRIPTION OF THE PREFERRED EMBODIMENTS

Figure 1:
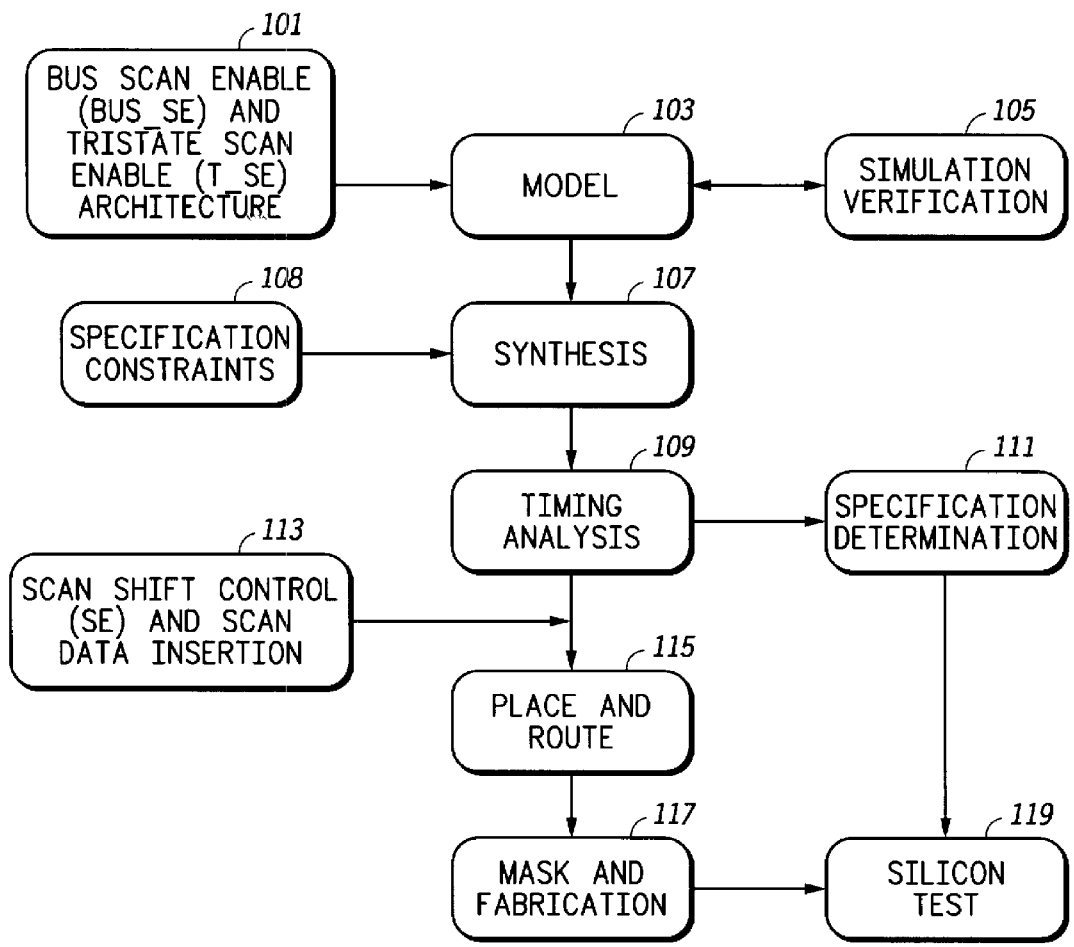
FIG. 1 is a flow diagram showing a methodology for the design and testing process involved in the design of an integrated circuit.

A more detailed presentation of the method and apparatus of the present example is discussed below in connection with the accompanying drawings. Since the apparatus implementing the present invention is, for the most part, composed of electronic components and circuits known to those skilled in the art, circuit details will not be explained in any greater extent than that considered necessary as illustrated, for the understanding and appreciation of the underlying concepts of the present invention and in order not to obfuscate or distract from the teachings of the present invention.

Note that the terms functional logic, operational logic, and system logic may be used interchangeably in this application.

In general, the overall chip design cycle begins with a functional specification for the chip to be designed at a relatively high or broad descriptive level. The functional specification is then translated into a technology-independent behavioral hardware description language (HDL) model. The development of a behavioral model or HDL model next undergoes a verification step. The HDL modeling step typically takes from six weeks to three months. Next, an implementation is derived from a Full Synthesis of the HDL model which is used to synthesize a technology-dependent model or prototype based on a specific technology. The Full Synthesis step includes the processing of the HDL model to a mapping into a gate level description with optimization steps being applied to meet area and timing budgets, and a static timing analysis assessment. Area in this case is defined as a number of transistors required to meet some established budget, and timing is defined as the sum of estimated propagation delays, since there is no "physical" representation at this point in the design flow. Typically this step also includes a verification function, and if the particular prototype design being tested fails to meet or comply with the functional specification, or fails to meet or comply with the area or timing budgets, then the process reverts back to the next earlier step. In this case the previous step would be to apply synthesis again after adjusting the synthesis tool parameters, or the design directives. If this still does not produce a compliant design, then the process reverts all the way back to the development of the HDL model, and the model is reconfigured until the failed test is passed or the budgets are met. An average time for the Full Synthesis/Timing/Optimization step itself, is a few days. The whole iterative process of Synthesis and then returning to the HDL model and Synthesis again until the design is compliant, may take months.

The typical design process continues with a Full Synthesis, with Timing and Optimization processes providing a logical database or netlist of the prototype circuit. The design is still in the logic stage at this point and the netlist step is effective to map the prototype circuit to a library of logical devices. Again, typically, various aspects of the netlist are checked for compliance with a specification or a budget. Behavioral operation vectors may be used to verify that the netlist produces the same responses as the HDL model. If there is non-compliance, the process returns to the Full Synthesis step so that the synthesis directives can be changed, or back to the HDL Model step to restructure the model. The return point of the process depends on the type of non-compliance found. The prototype design is then re-synthesized and re-verified until the prototype "netlist" is within specifications and "passes" the verification step.

Next in the typical methodology, a "Place and Route" process is then applied to provide a physical component or transistor level netlist. Again this step includes verification for budget compliance, for example for chip area or "real estate" requirements, and if the prototype design, after being laid out by the "Place and Route" process exceeds the area budget, the process returns to a preceding step of either the HDL Model or the Synthesis step, and the prototype is modified and tested again in each step of the flow until it is again submitted to the Place-and-Route step. These iterative steps are repeated until the product of the Place-and-Route step, i.e. the prototype layout, meets the specification and area budgets. The "Place and Route" step, on average, takes on the order of two days to two weeks to accomplish. Accordingly, at least for the first time through on new designs, the time required to arrive at this point in the design process may be close to four months.

Next in a typical design and test process, a "Full Scan Insertion" step is applied. The scan insertion can be done in several ways and is generally used to connect internal sequential elements such as flip-flops, into scan shift registers. If necessary, scan control signals may also be added to the design. For example, the worst case scan insertion step would be to exchange normal D-type flip-flops for scannable flip-flops with a multiplexer prior to the D input, to connect the scan data in (SDI) ports of the multiplexers to the Q output ports of the flip-flops in such a way as to create scan shift registers, and to route a scan enable signal (SE) which is used to allow the scan multiplexers to select the functional path (FP) or the scan path (SP). The scan insertion may be accomplished by modifying the design database prior to entering the Place-and-Route step, or it may be done directly by the place-and-route tool, or it may be done as a post processing step after the place-and-route finishes operating on the functional logic. After the Place-and-Route and Scan Insertion steps are done, there are two products provided, i.e. the final netlist or layout which is verified and used for "Design-for-Testability" (DFT) rule checking and vector generation, and the stream file. The stream file is sent to a maskmaker, and the mask that is made is sent to a wafer fabrication facility. The Stream File is used to generate the masks which are utilized to fabricate the newly designed integrated circuit or chip. At this point in the design and test process, verifications and manufacturing tests are conducted to ensure that prescribed manufacturing criteria are met, and the iterative process with the Stream File step or other steps, may be continued until such manufacturing criteria have been met.

It is generally at this point in the process that the scan circuitry, as herein disclosed, may be used for the purpose of testing the AC timing specifications of the circuit. It should also be noted however, that the disclosed scan methods and circuitry may also be used for other purposes and the present invention is not intended to be limited to the use of scanning techniques solely for the purpose of AC specification testing as disclosed in the present example.

As shown in FIG. 1, a design model 103 is modified in accordance with requirements of a BUS Scan Enable "BUS_SE" and Tristate Scan Enable "T_SE" architecture 101. The model 103 continuously undergoes simulation verifications 105 throughout the design process. The model undergoes a synthesis process 107, with specification constraint inputs 108, and then a timing analysis 109. At this point, the model is checked for specification determination 111 and device or silicon test 119. Also, following the timing analysis 109, the scan shift control and scan data insertion processes 113 are applied before the place and route step 115. Following the place and route function 115 in the present example, mask and fabrication functions 117 are accomplished and silicon testing 119 of the individual manufactured parts or devices is undertaken.

Normally when a scan methodology is being used, the ability to assess the design for test (DFT) scan rule violations happens late in the design process. After passing the design rule check, a check is conducted to test the ability to generate vectors and to find areas where the vectors are not effective in detecting possible defects or faults that may occur. This is referred to as "fault coverage". These checks happen late in the design process because scan test assessment and typical vector generation requires a gate-level netlist mapped to a standard cell library. This implies that a design netlist that is already mapped to a technology library and has the scan connections inserted, is needed before any design-for-test or DFT analysis can be done. Unlike the present example, in most cases, the scan connections and Scan Enable are added during a "Place-And-Route" step. The scan operation is available after scan connections are inserted during a "place-and-route" step in the integrated circuit design and test process. The scan testing process is implemented to carry out the "structural testing" of an integrated circuit design as hereinafter described.

As hereinbefore noted, there are several requirements for testing a newly designed integrated circuit. Design testing is carried out for the purpose of establishing that the new design meets certain design goals such as performance specifications (frequency) and chip area limitations. Functionality is also tested to ensure that the new design functions as specified. In testing for functionality, a newly manufactured chip part is generally inserted into a relatively expensive test unit and input vectors are applied at designated chip input terminals. Thereafter, certain chip output terminals are strobed for "state" condition to determine if a desired output state results from the application of a selected input state or vector. In general, millions of input test vectors must be applied in order to provide even a minimal coverage testing for possible functionality faults. The test process includes (for "AC" testing) applying a functional test vector, then running a predetermined number of clock pulses (depending on the design of the part), and then reading out or strobing the appropriate output terminals.

"AC" testing refers to the testing of circuitry which includes a number of sequential circuit elements, for example flip-flop circuits, in addition to groupings of combinational or flow-through logic circuits. "DC" testing on the other hand refers to the testing of purely combinational logic circuits where there may be a device related path delay but no clock "waits". When the circuit being tested includes flip-flops, i.e. an "AC" circuit, then clock pulses must be applied to propagate the effect of an input vector to various points along the scan path and eventually to the output terminals being strobed. Whenever clock pulses are running, there are unavoidable "waiting" delays and when millions of test vectors are applied with each requiring a plurality of clock pulses before output readout, the testing process may involve many millions of clock pulses or "clocks". Thus vector testing is considered to be a relatively inefficient testing method in terms of "fault coverage per unit time".

A degenerate form of scan testing has guaranteed AC specifications by ensuring that all the interface signal paths used in scan testing are identical to those used in normal functional operation. That alternative design scheme imposes an architectural performance impediment in that all inputs and outputs must have flip-flops without any combinational logic between the pins and those "registers" (i.e. strings of flip-flops). The registers are then used as the first or last flip-flops in scan chains for inputs and outputs, respectively. Also, in that scheme, only unidirectional signal pins are suitable for use as scan ports. Accordingly, that design scheme is not practical for all cases.

Figure 2:
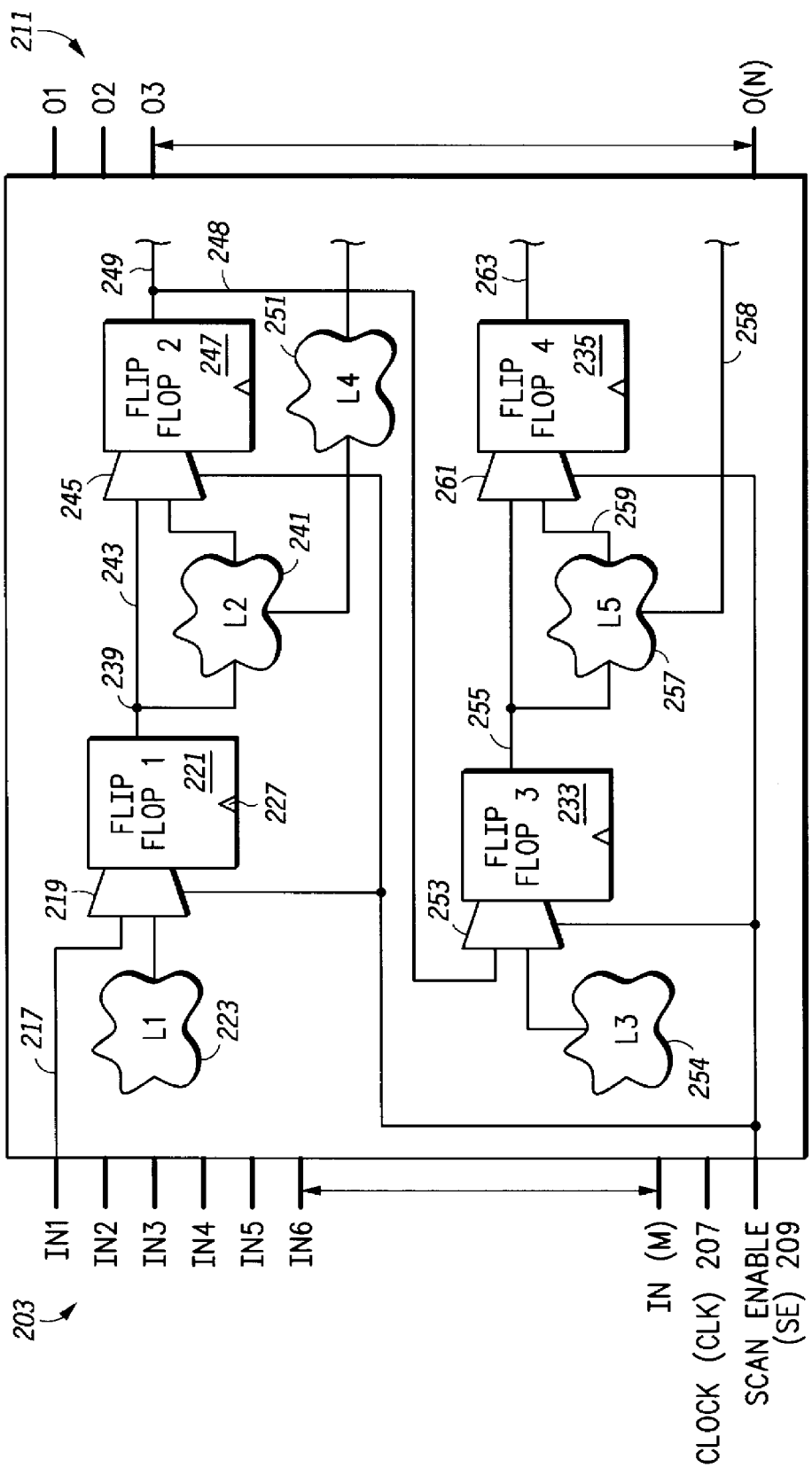
FIG. 2 is an illustration useful in explaining a scan enable testing process.

As shown in FIG. 2, a exemplary integrated circuit 201 includes a plurality of input pins 203 and also a plurality of output pins 211. The output pins 211 are shown along the right-hand edge of the integrated circuit 201 and designated O1 through O(N). The input pins 203 are shown along the left edge of the IC (Integrated Circuit) 201 and designated "IN1" through "IN(M)" and may include any number of inputs. Also shown are input pins arranged for receiving a clock (CLK) signal 207 and a Scan Enable (SE) signal 209. It should be noted that in the illustrated drawings, not all of the electrical connections are shown in order to simplify and not unduly obfuscate or clutter the drawings, and thereby to facilitate the presentations for easier understanding. For example, in FIG. 2, the IC 201 contains four flip-flop circuits 221, 233, 235 and 247. Each of the flip-flops has a CLK signal 207 applied at a clock terminal of the flip-flop (e.g. clock terminal 227 of flip-flop circuit 221) although the actual connections are not shown in the drawing. In the illustrated circuit shown in FIG. 2, one input pin IN1 is connected by signal line 217 to one input terminal of a multiplexer circuit 219.

Other chip input signals (not illustrated) are applied to a combinational logic circuit L1 223 which is shown as having one output thereof connected to another input terminal of the multiplexer 219. The multiplexer 219 is applied to the input of flip-flop FF1 circuit 221 which, in turn has an output connected to a common point 239. The point 239 is connected to another combinational logic circuit L2 241 as well as through path 243 to one input terminal of another multiplexer 245. Another input terminal to the multiplexer 245 receives an input signal from an output of the logic circuit L2 241. The multiplexer 245 has its output connected to the input of the flip-flop circuit 247. The output of the flip-flop 247 is connected by path 248 to an input terminal of another multiplexer circuit 253. The output from the flip-flop circuit 247 may also be connected via common point 249 to additional circuits (not shown) on the integrated circuit 201 and/or to one of the output terminals 211. The combinational logic circuit L4 251 has one input signal applied from the logic circuit 241 and has an output signal applied to signal line 251. Signal line 251 may also be connected to additional circuitry on the chip 201 or directly to an output terminal 211. Multiplexer 253 receives a second input in the FIG. 2 example from a combinational logic circuit L3 254.

It is understood that circuit 254 has various input signals applied thereto which are not shown in the drawing for the sake of simplicity. The multiplexor 253 has its output connected to a third flip-flop FF3 233. Flip-flop 233 has an output terminal connected through path 255 to one input terminal of multiplexer 261. The output of flip-flop 233 is also connected by path 255 to a combinational logic circuit L5 257, which, in turn, has an output thereof connected through path 259 to another input terminal of the multiplexer 261. Logic circuit L5 257 has another output connected through path 258 to additional circuitry which is not shown in the present example. The multiplexer 261 has its output connected to the input of a flip-flop FF4 235 which has an output terminal connected through signal line 263 to additional circuitry or to one of the output terminals 211. All of the illustrated flip-flop circuits 221, 233, 235, and 247 have clock input terminals (e.g. clock terminal 227 of flip-flop 221) which are connected to a system clock signal 207. Also, each of the multiplexer circuits 219, 245, 253 and 261 have selector or control terminals thereof connected to an input terminal for receiving Scan Enable (SE) signal 209. The FIG. 2 example involves a scan enable ("SE") control signal which is characteristic of the multiplexed or "MUXed" D flip-flop scan path design style. The SE signal is conventionally used as the scan MUX selector to switch flip-flops in the design between shift operation defining a "scan path" (217, 243, 248, 255 and 263), and normal system operation defining a "functional path" through the logic circuits 223, 241, 251, 254, and 257 of the chip 203.

Figure 3:
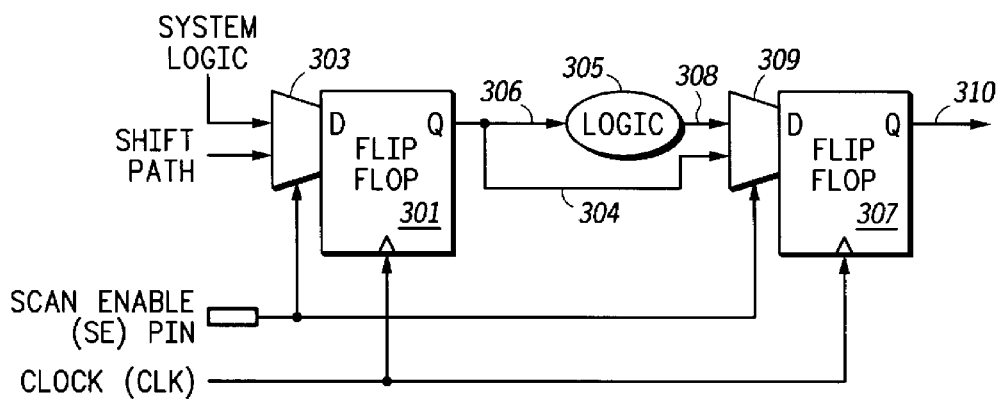
FIG. 3 is schematic diagram illustrating the scan operation in a circuit designed in accordance with the present invention.

In FIG. 3, the scan and functional paths are illustrated in more detail. A "D" flip-flop 301 receives a System Logic signal and a Shift Path signal as inputs through a selector or multiplexer 303, and provides an output which is sent through a scan path 304 and also through an operational path 305, 306 and 308 to another multiplexer or selector 309. Multiplexer 309 is applied to the input of flip-flop 307 which in turn generates an output signal on signal line 310. As hereinbefore noted, the flip-flop circuits also receive Scan Enable (SE) and Clock input signals. In that scheme the SE signal is also used as a dynamic selector of bidirectional pin direction. When SE indicates a shift operation, some pins are "forced" to be scan-in ports while others are "forced" to be scanout ports. This "forcing" overrides the normal tristate controls and normal combinational paths between pins and flip-flops. When the SE signal indicates normal system operation, the scan "forcing" is relinquished, allowing the pin to assume whatever I/O direction state that is indicated by a normal operation state of the machine, i.e. the functional path is restored. At that time the normal operational state of the machine is the machine state which was configured by the immediate antecedent shift operation. Thus, the above scheme uses the SE signal, in addition to its conventional purpose, to force the scan port directions during shift operations, and then releases those ports to a normal machine configuration for the system interval of the scan test.

For its conventional use as a scan MUX selector, the SE signal has set-up and hold time requirements relative to the clock (CLK) edge. It is designed as a tree similar and parallel to the clock tree so as to control the skew or displacement of the SE signal relative to the CLK over the range of manufacturing process results. Now if the SE signal is also used to control the scan ports, this adds timing constraints on the design that may (1) be impossible to satisfy across the process window, or (2) require some of the tests to be run at slower speeds. The latter possibility directly reduces the effectiveness of the tests at measuring the AC timing of the pins. Current use of scan enable is problematical in that the scan interface, the scan flip-flop shift MUX, and other scan controlled items such as tristate drivers, all have disparate timing requirements. There is also a design problem in that some design methodologies insert the scan enable function late in the design flow (just prior to "place and route") and there is no way to assess the impact of the signal during synthesis and logical verification in areas where the signal is used for purposes other than for the conventional flip-flop shift select between the scan path and the functional path.

The present disclosure uses three different control signals, viz. "scan_enable" (SE), "bus_scan_enable" (BUS_SE) and "tristate_scan_enable" (T_SE). Those signals are implemented at different points in the design cycle, and have different timing requirements. The SE signal is the conventional MUX D flip-flop scan MUX selector that enables shifting or sampling by the flip-flops in the circuit. The BUS_SE signal is the scan interface directional control signal that forces and releases bi-directional pins used as scan ports i.e. as the beginnings or endings of the scan chains. The T_SE signal is the tristate control signal that forces tristate drivers that are embedded in the integrated circuit being tested, to a non-contentious state during a shift operation, and releases that "forcing" during the normal system interval.

The SE signal is placed into the netlist after the synthesis operation but before or during the place-and-route operation in the present example. This is because the timing requirements of the SE signal are separate from functional timing requirements and insertion provides optimum results. The timing requirements on the SE signal are such that the SE signal transitions from an asserted state to a de-asserted state after a rising edge of a clock (CLK) associated with the last shift operation. The transition must be delayed slightly after the clock edge to account for clock skew and hold time requirements of the scan chain. The signal is asserted again with respect to the set-up time relationship to the clock and that specification is established based on the delay of the distribution network of the signal. The distribution network is best balanced and optimized when the above purpose is the only purpose for which the SE signal is used.

The BUS_SE signal is modeled behaviorally prior to the synthesis operation because the BUS_SE signal interacts with the system interface and needs to be assessed and optimized so that it does not determine the worst case timing requirements for the system operation of the pins which comprise the scan ports. The BUS_SE signal is timed so that it is effective at all of the sites or endpoints at which it operates as early in the system interval as possible without interfering with the last shift operation. The BUS_SE signal also has to propagate through a distribution network. The point at which the BUS_SE signal may be transitioned is related to the timing specifications of the various pins with which the BUS_SE signal interacts in the scan port. Those specifications vary from pin-to-pin, and also across processes and operating conditions such as voltage and temperature. Each of the endpoints of the BUS_SE signal impose constraints on when the signals applied to the part being tested may transition and determine the timing margin considering the range of manufacturing process variability. All of the variables involved require that the BUS_SE signal have a variability that may cross clock boundaries much more than can be expected from the SE signal.

Figure 4:
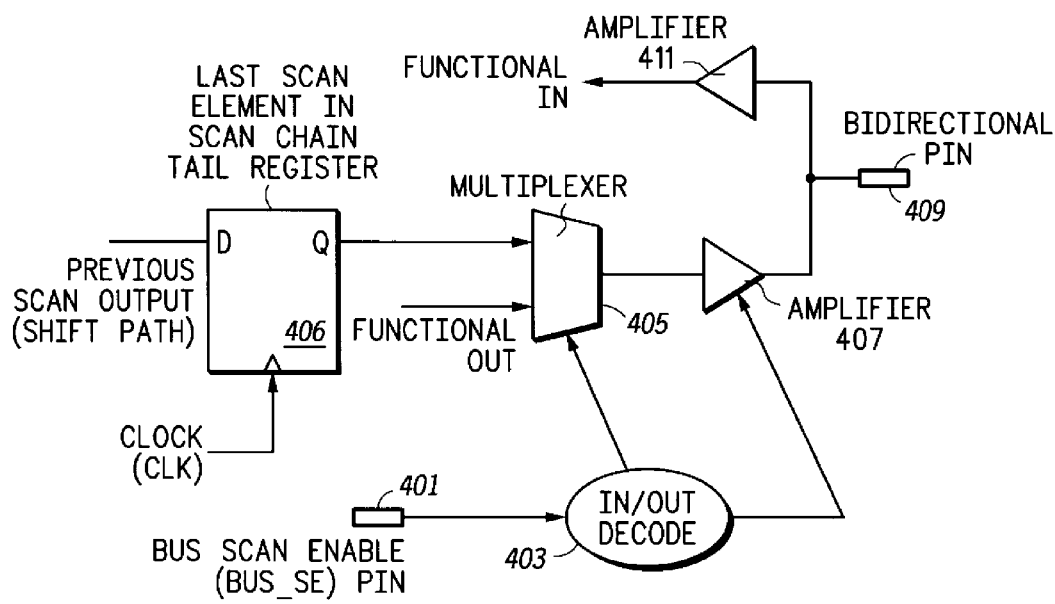
FIG. 4 is a schematic diagram illustrating one aspect of the disclosed embodiment.

In FIG. 4 for example, a BUS_SE signal is applied to an input pin 401 which is connected to an IN/OUT DECODE circuit 403. A multiplexer circuit 405 is controlled by an output from the IN/OUT DECODE circuit 403. The multiplexer receives an IC functional signal labeled "FUNCTIONAL OUT" and a scan path signal labeled "SCAN OUT" as inputs thereto and applies an output signal to an amplifier 407 which is also controlled by the IN/OUT DECODE circuit 403. An output from the amplifier 407 is connected to a bi-directional pin 409. Bi-directional pin 409 is also connected to selectively provide an input to another amplifier 411. Accordingly, depending upon the state of the BUS_SE signal and the output from the IN/OUT DECODE circuit, the pin 409 will function as an output pin for a scan output signal, a functional output for system logic, or an input pin for receiving a scan input signal. In one embodiment, a "tail" register 406, may be included as the last register in the scan chain. Tail register 406 is implemented as a D type flip-flop having an input terminal coupled into the scan path and an output terminal coupled to an input terminal of the multiplexer 405. Tail register 406 aids scan process by adding an additional gate delay to shift out data to relax timing constraints.

Figure 5:
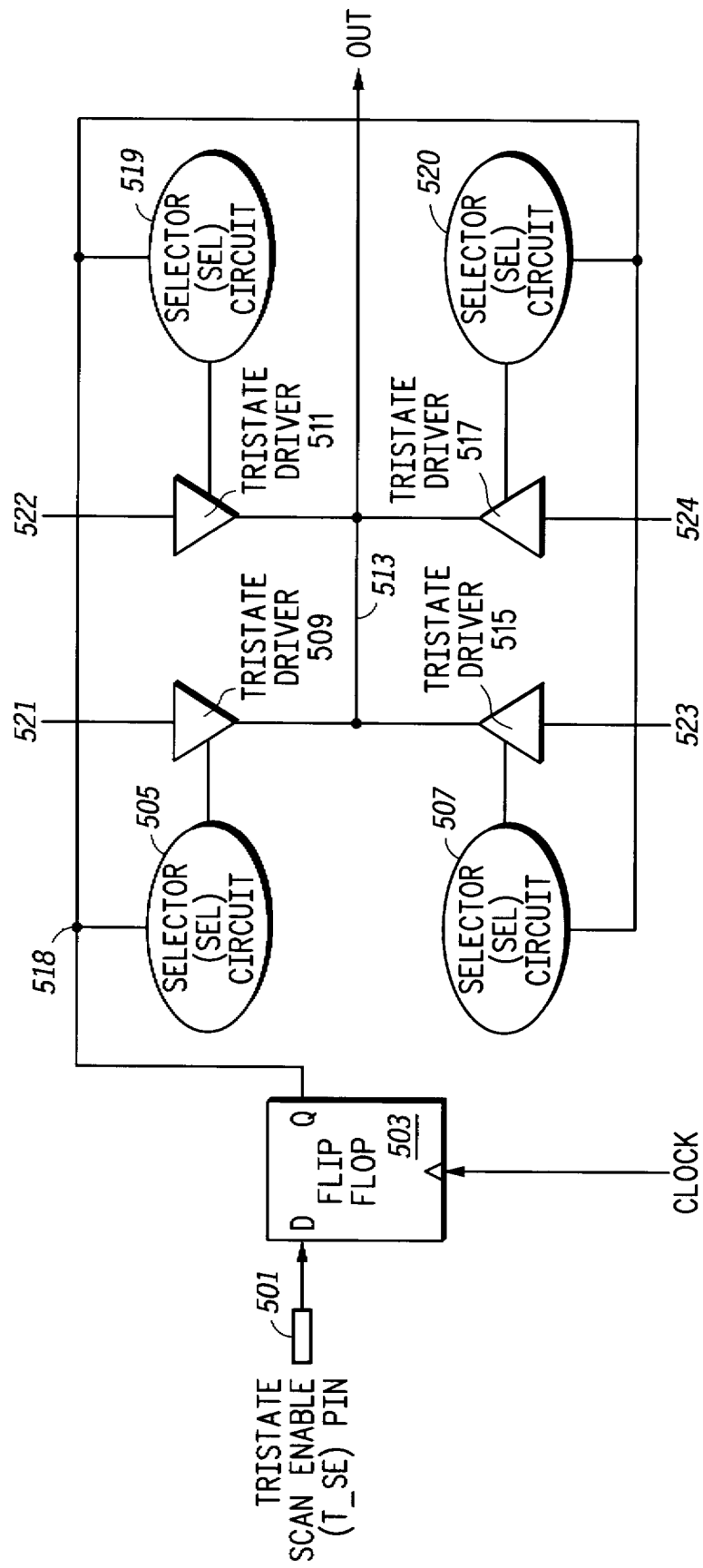
FIG. 5 is a schematic illustration showing the operation of another aspect of the disclosed embodiment.

The T_SE signal is modeled behaviorally prior to the synthesis operation (see step 107 in FIG. 1) in the present example, because T_SE interacts with the system embedded tristate logic and needs to be assessed and optimized so that embedded busses with multiple drivers do not suffer from performance degradation and that the method of non-contention can be established during the design phase. A circuit receiving T_SE is illustrated in FIG. 5. For example, all of the tristate drivers can be forced off while maintaining the signal's value with a weak device (pull-up, latch or keeper), or one driver can be forced to drive while all others are disabled, so that the multi-driven signal is not allowed to float. The T_SE signal is timed so that the transitions to the non-asserted state occur immediately at the clock edge associated with the last shift operation. That allows the tristate drivers on a bus the maximum amount of time to resolve to the correct drive/receive states. Because no sequential elements are controlled, the T_SE signal is best distributed from a flip-flop that will cause the transitions to occur as close to the clock signal edges as possible.

As shown in FIG. 5, the T_SE signal is applied to pin 501 which is connected to the input of a flip-flop circuit 503. Flip-flop 503 also receives a clock signal CLOCK and provides an output 518 to first, second, third and fourth Selector (Sel) circuits 505, 507, 519 and 520, respectively.

Sel circuits 505, 507, 519 and 520 are arranged to control tristate drivers 509 and 511 as well as 515 and 517, respectively, which control a drive/receive status of signal lines 521, 522, 523 and 524, respectively, which are connected to a common output 513.

The T-SE input pin 501 is controlled in a manner such that, during the shift operation, signal 518 acts upon a single particular selector, for example selector 505, so as to uniquely control tristate driver 509 to couple signal line 521 to the common output point 513. Signal 518 also acts upon selectors 507, 519 and 520 to control tristate drivers 511, 515 and 517, respectively, to exclude any coupling of signals 522,523 and 524, respectively, to common output point 513. This ensures that any logic circuits which receive output 513 as an input, have a valid logic one or zero, and the receiving inputs are not un-driven during a shifting operation. This further ensures that there cannot be multiple drivers among the set of drivers 509, 511, 515 and 517, simultaneously driving common output point 513 during a shift operation when essentially random states are being propagated. This set of actions upon drivers 509, 511, 515 and 517 during shift operation is referred to as "scan forcing". During the normal system operation test cycle, the scan forcing action of signal 518 is released and a test which has been predetermined, will uniquely select a single driver to enable, from the set of drivers 509, 511, 515 and 517.

FIG. 3, FIG. 4 and FIG. 5 show how the three scan control signals SE, BUS_SE and T_SE signals are generated and used. The SE signal originates from a pin and is distributed to all scan flip-flops in the part being tested to control the scan shift MUX i.e. when the flip-flop MUXs are set to scan mode and when they are set to functional mode. The BUS_SE signal originates from a pin and is distributed to the scan interface to ensure that the pins are allowing data to flow in the right direction during shift, i.e. through the scan path, and that the pins are allowing data flow through the functional path during the system operational state for the specification measurement.

The T_SE signal is distributed to all embedded tristate drivers to ensure that no contention occurs during the shift operation, and that the drivers resolve to a normal operation state during the fault coverage exercise and sampling cycle. The BUS_SE and T_SE signals interact with the operational logic of the integrated circuit or part being tested as override signals when they are asserted. The T_SE signal is registered to synchronize its assertion and de-assertion to the clock edge.

Figure 6:
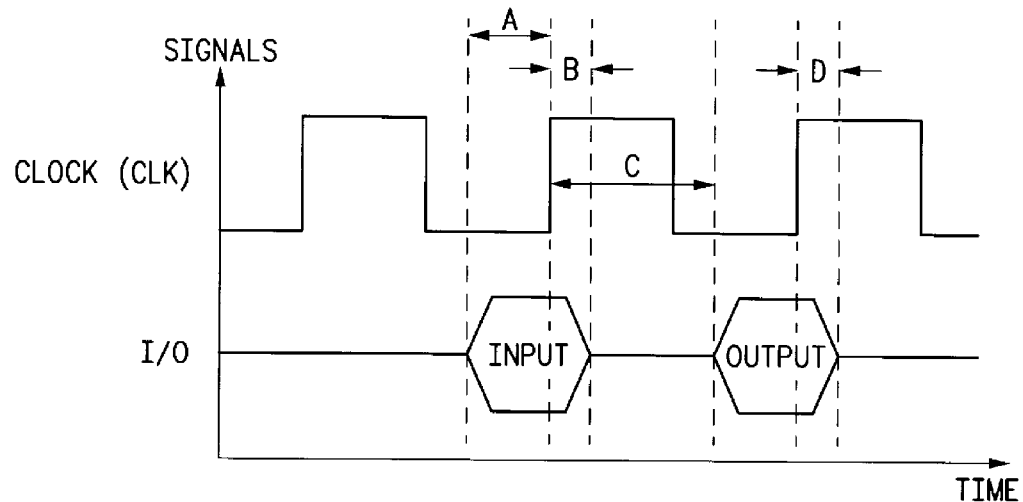
FIG. 6 is a timing diagram illustrating several timing specifications with regard to the disclosed embodiment of the present invention.

The "AC" specifications of an integrated circuit are illustrated in FIG. 6 relative to an exemplary clock signal and input/output signal profiles. The AC specifications include input set-up time "A", input hold time "B", clock-to-output or output valid time "C", and clock-to-tristate or tristate valid time "D". In addition, there is an output hold-time specification. Input set-up time "A" is the amount of time that a signal has to be present and stable before a clocked sequential device will sample it. The input set-up time "A" is usually specified with reference to a clock signal. The input hold time "B" is the amount of time that a signal has to remain stable to ensure that a clocked sequential device has sampled it and will retain it. Input hold time "B" is usually specified relative to a clock signal as well. Clock-to-out or out-put-valid time "C" is the amount of time from a reference time or event that it takes for an output pin to have valid data. Output valid time is usually specified in terms of time from a clock edge. Output-tristate or tristate-valid time "D" is the amount of time from a reference time or event that it takes for driven data to be supplanted by a high impedance state. The output-hold time is the amount of time that valid data is available for sampling and is usually specified from a clock edge or from the output-valid time "C". These specifications are required to allow a user of the device to define how to use the device in the user's own environment, i.e. within the user's system incorporated with an integrated circuit. These specifications define when external stimuli can be applied and for how long, and when the device outputs may be sampled and for what time period.

The disclosed exemplary embodiment illustrates how the scan process can be implemented to allow the scan architecture to verify the AC behavior of a device being tested instead of merely testing the DC defect level. Adding signals that allow the scan operation mode to convert to normal operational mode within one cycle at the rated frequency makes it possible to verify the AC specifications of a manufactured integrated circuit part, and to test against AC defect models such as transition or gate delay, and path delay fault models. By having separate signals for each of the types of logic (i.e. SE for sequential logic, BUS_SE for I/O control logic and T_SE for internal tristate logic) under test control during the shift cycle adds the ability to control each of the disparate logic areas with different tester timing. The use of SE, BUS_SE and T_SE signals as illustrated herein, provide control signals that intermingle with the operational logic being modeled. Accordingly those signals will be synthesized and optimized with the rest of the operational logic. However, the scan data connections and the shift control signal can be post-synthesis scan inserted into the design cycle flow since the scan-test circuits are separate from the operational logic. In that manner, the scan architecture has minimal impact on the size and performance of the device being designed. Modeling the BUS_SE and the T_SE signals also allow the scan interface to be verified by simulation methods. As illustrated by the exemplary embodiment, the pin specifications can now be generated using deterministic AC path delay type automatic test pattern generation (ATPG). Those deterministic vectors can be generated against paths identified by an automated timing analysis methodology. Instead of using thousands or millions of clock cycles worth of operational vectors to verify the AC specifications of "input set-up time", "input hold time", "output clock-to-valid", "output clock-to-tristate" and "output hold time", those specifications can be verified with substantially fewer scan vectors per pin.

Figure 7:
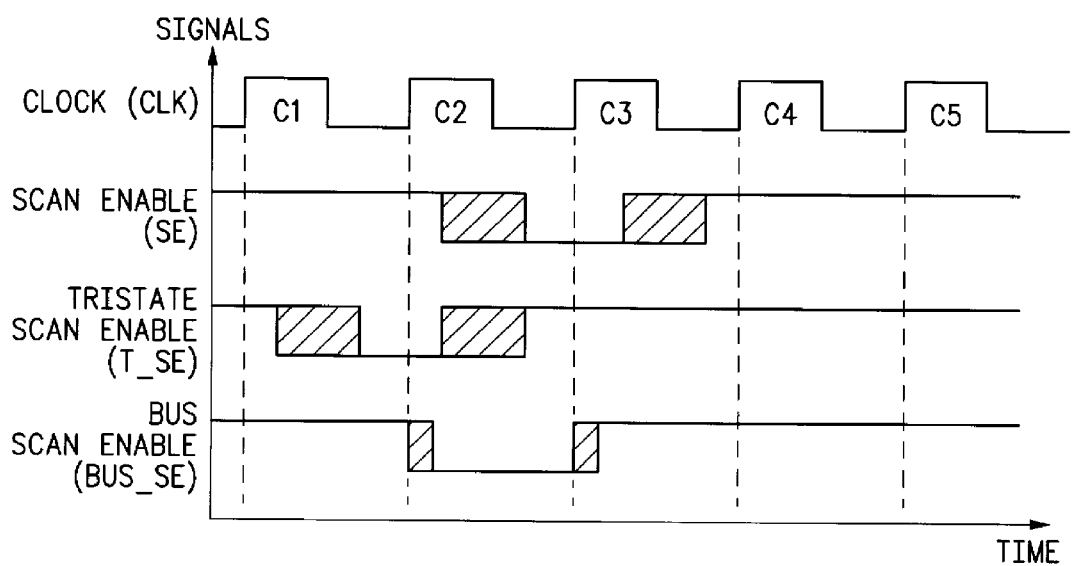
FIG. 7 is a timing chart illustrating the timing relationships among various timing signals shown in the example.

The timing requirements of the SE, BUS_SE and T_SE signals are compared to each other and also relative to the CLK signal as shown in FIG. 7. Note that the BUS_SE signal has a variable range in which it may be asserted and de-asserted. Each of SE, BUS_SE and T_SE have a range of acceptable timing as shown in the cross-hatched portions of FIG. 7.

It is also of note that the present teachings are not limited to the MUX D flip-flop type of scan and do not require the existence of the SE signal. The BUS_SE and T_SE signals are control signals that are independent of the sequential elements used in the design of the part or device itself. Signals such as the BUS_SE and T_SE signals can also be used with a level-sensitive scan design "LSSD", (e.g. including latching circuitry vis-a-vis flip-flops), or other type of scan implementation with equal effectiveness since the BUS_SE and T_SE control signals are not logically the same as the scan enable signals such as the SE signal.

Using the scan testing method disclosed herein, an integrated circuit can be more comprehensively tested to a frequency or performance specification using orders of magnitude fewer clocks per part thereby significantly reducing the testing time per part in the integrated circuit design and test process. As herein disclosed in detail, the use of a selectively variable duration signal in the scanning process results in a substantial reduction in part or device testing time. A parallel scan is, in effect, performed using borrowed or MUXed functional chip pins. A selectively variable "BUS_SE" signal allows precise strobing in view of variations introduced by: (1) worst case "hold time" for the circuit (i.e. what is the earliest time after CLK that the circuit can be strobed); and (2) best case "output hold" for the circuit (i.e. what is the latest time after CLK that the circuit can be strobed). Using the disclosed method, scan vectors can be used to do frequency testing as well as reducing the vectors required to be applied for fault testing. Tristate devices are also controlled during the shift mode of the scan process.

The timing constraints with the BUS_SE signal are often very difficult to meet reliably. There are two sets of constraints that apply viz. A first set that applies to the assertion of BUS_SE (transition from sample or capture, to shift operation), and a second set that applies to negation of BUS_SE (transition from shift operation to capture operation). Both sets of constraints include both best case process and environment constraints and worse case process and environment constraints. The best case constraints determine the earliest time at which BUS_SE can transition, and the worse case constraints determine the latest time at which BUS_SE can transition. At the rated frequency of operation of the system clock, it is possible that the earliest time at which BUS_SE can transition to meet the best case constraints is later than the latest time at which BUS_SE can transition to meet the worst case constraints. In other words, there exists some frequency of operation at which the timing window, bounded on one side by the best case constraints and on the other side by the worst case constraints, collapses to zero width and beyond. If that frequency does not exceed the target frequency of operation for the design, the integrated circuit product cannot be tested at the rated operational frequency. This potential problem may be avoided through an implementation as hereinafter explained.

The assertion constraints are alleviated by an extension of the time period between the sample operation and the first subsequent shift operation. BUS_SE is asserted in the middle of that extended interval. Because the extension occurs immediately after the sample event and not before that event, the time duration between the last shift preceding the sample event and the sample event itself is unchanged and occurs at the rated operational frequency. The addition of the extension period alleviates the BUS_SE best case and worst case assertion constraints by an amount exactly equal to one-half of the duration of the extension period. If BUS_SE assertion is not placed at the mid-point of the extension period, best case and worst case assertion constraints will be alleviated to differing degrees, but the sum of the improvements in each will equal the duration of the extension period.

Because the negation of BUS_SE occurs between the final shift event of a sequence of shifts, and the capture, it occurs during an interval that cannot be lengthened without resulting in the logic under test being tested at a slower speed than the rated operation frequency. If BUS_SE were to negate too early it would cause the final shift into the device to be unreliable, i.e. the data shifted into the first memory element in the chain, which is the element that directly captures the scan input during a shift operation, could be incorrectly captured. On the other hand, if BUS_SE were to negate too late, it would cause the operation during the capture cycle, i.e. the interval between the final shift and the capture, to be unreliable. Depending upon whether a given bi-directional pin were acting as an input or an output during the capture cycle in question, the capture of incoming data or the observation of outgoing data would be unreliable. The solution requires inclusion of an extra head flip-flop on each scan chain which has a scan input pin or a scan output pin that is affected by BUS_SE. This extra flip-flop per chain has only the next flip-flop in the scan chain as fanout and provides a placeholder where unreliable data can be shifted into the IC under test during the final shift before the sample without adversely affecting the test. Thus, even if the data shifted into that flip-flop is unreliable, it would not matter since that data does not affect the test results. During the capture event, that same flip-flop capture data is immaterial to the test. The data value will be the last data shifted out during the following sequence of shift operations, thus allowing the final shift-out data to be ignored. Together, the two results effectively alleviate the best case negation constraint on BUS_SE by an amount of time equal to one clock period. To better balance BUS_SE constraints, BUS_SE negation time can be made to occur one-half clock period earlier so that best case and worst case negation constraints are alleviated by an amount equal to one half of the clock period. Additional head registers could also be used to give additional improvement in BUS_SE constraints if necessary.

Figure 8:
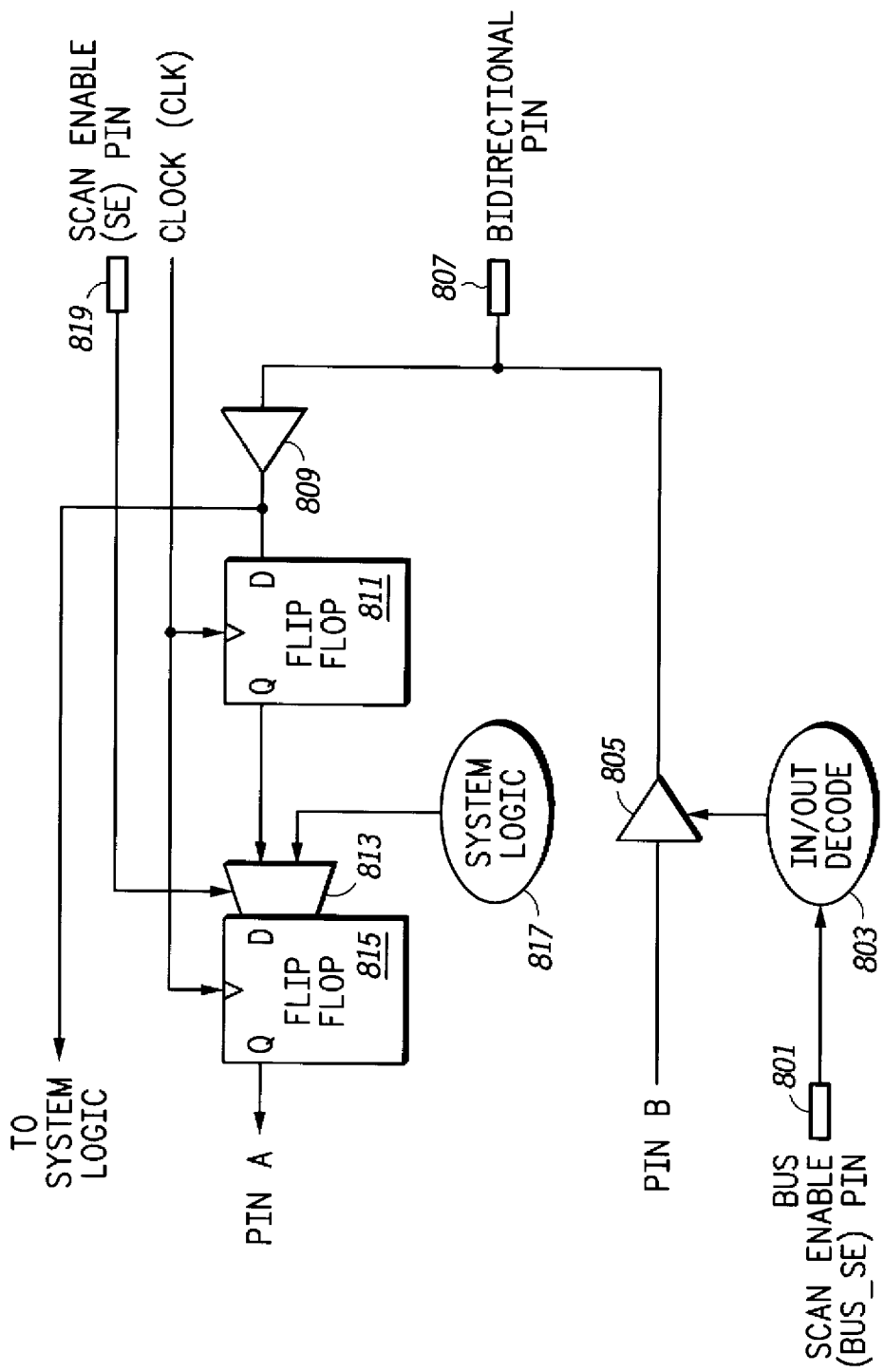
FIG. 8 is a schematic diagram illustrating an implementation of a scan chain flip-flop circuit inserted at the head of a scan chain.

One implementation of the above described design strategy is shown in detail in FIG. 8 which illustrates a BUS_SE pin 801 connected to IN/OUT Decode circuitry 803. The IN/OUT Decode circuit 803 determines the state of an amplifier 805. Amplifier 805 receives an input B, and applies an output signal to a bi-directional integrated circuit pin 807. Amplifier 809 has an input connected to pin 807, and provides an output to the system logic and also to the input of a flip-flop circuit 811. The flip-flop circuit 811, and corresponding lead flip-flops for scan chains throughout the integrated circuit, in the present example, function as a head register device and is not used in normal system operation on the integrated circuit. The output of flip-flop circuit 811 is applied to one input of a multiplexer circuit 813, the other input of which is connected to the System Logic circuitry 817. The multiplexer circuit 813 selectively provides an input to a flip-flop circuit 815 which, in turn, provides an output signal A. Both flip-flop circuits 811 and 815 are connected to receive system CLOCK signals as illustrated. Multiplexer circuit 813 receives a control signal SE from the SE pin 819. The SE signal, as hereinbefore noted, controls the enabling of the scan testing process at the sequential elements of the circuit.

Thus, in FIG. 8, a sequential device such as a flip-flop circuit 811 is inserted at the heads of the scan testing circuits (including flip-flop 815 for example) on an integrated circuit. That implementation aids in the timing requirements of the scan process and eliminates the "best case" and "worst case" requirements on the BUS_SE signal assertion because an extra clock is provided both before and after assertion. That situation applies to the SE signal as well. The extra flip-flop at the scan chain heads makes the first shift in and the last shift out inconsequential or "don't cares", thereby moving the best case speed BUS_SE negation time back one whole cycle, and relaxing that constraint by one clock period for both scan inputs and scan outputs.

FIG. 9 illustrates the usage of NOCLK vectors and extra flip-flops at the head of scan chains. The "NOCLK" vectors are provided by a test apparatus external to the integrated circuit. No shifting operation and no capture operation occurs during the "knuckle" portion of time. The timing relationships illustrated in FIG. 9 may be applied to the circuitry illustrated in FIG. 8.

FIG. 10 illustrates the skewing of scan-in data by one cycle relative to scan-out data in addition to the usage of NOCLK vectors. Unlike FIGS. 8 and 9, the timing relationships illustrated in FIG. 10 do not utilize an extra flip-flop at the head of each scan chain. Instead, the timing relationships illustrated in FIG. 10 use NOCLK vectors in combination with a one cycle skew between scan-in data and scan-out data. By skewing the input data such that the first real scan input is applied at the second shift rather than the first (and an extra shift is done), the first shift in and the last shift out are made inconsequential, and this gives one clock period extra time on best case speed BUS_SE negate for scan outputs only. Alternate embodiments of the present invention may use other timing relationships than those illustrated in FIGS. 9 and 10. The timing relationships illustrated in FIGS. 9 and 10 are illustrated merely as examples.

The method and apparatus of the present invention has been described in connection with the preferred embodiment as disclosed herein. Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method for testing timing specifications for an integrated circuit, said integrated circuit having functional circuit paths including sequential circuit elements therein, said functional circuit paths being designed to implement a specified functional specification and provide functional output signals at output terminals of said integrated circuit, said method comprising the steps of:

providing a scan path on said integrated circuit, said scan path being selectively routed on said integrated circuit among selected sequential circuit elements, said scan path being terminated at said integrated circuit output terminals, said integrated circuit input/output terminals also being arranged to selectively provide functional output signals for said functional circuit paths;

applying a first testing signal to said integrated circuit, said first testing signal being operable to effect a testing signal propagation through said scan path and provide a timing output signal at one of said integrated circuit output terminals; and applying a second testing signal to said integrated circuit, said second testing signal being applied independently of the first testing signal and independently of the sequential circuit elements, the second testing signal operable to control when the output terminal is used to provide the functional output signals and when the output terminal is used to provide the timing output signal.

2. The method as set forth in claim 1 and further including validating said timing output signal from said integrated circuit output terminals.

3. The method as set forth in claim 2, wherein said sequential circuit element is a latching circuit.

4. The method as set forth in claim 2, wherein said sequential circuit element is a flip-flop circuit.

5. The method as set forth in claim 2, wherein said method further includes:

switching from said scan path to said functional circuit path following said validating of said timing output signal.

6. The method as set forth in claim 2, wherein said method further includes:

switching from said functional circuit path to said scan path following a predetermined delay time of said timing output signal.

7. The method as set forth in claim 2, wherein said integrated circuit further includes at least one tristate device for driving at least one signal line, said method further including selectively enabling and disabling said tristate device during said testing signal propagation.

8. An integrated circuit comprising:

a plurality of input terminals;

a plurality of output terminals;

logic circuitry connected between said input terminals and said output terminals, said logic circuitry defining a functional circuit path, said logic circuitry including at least one sequential circuit element, said logic circuitry being selectively operable to implement a functional specification for said integrated circuit through a functional circuit path to provide functional output signals at said output terminals; and testing signal circuitry connected between said input terminals and said output terminals, said testing signal circuitry defining a testing circuit path, a scan enable signal being applied to said test signal circuitry for controlling shifting of the test data through said testing circuit path, said testing signal circuitry further including a first switching device connecting one of said input terminals to an input terminal of said sequential circuit element, and a second switching device connecting an output terminal of said sequential circuit element to one of said integrated circuit output terminals, said first switching device and said second switching device being controlled by a bus scan enable signal, the bus scan enable signal being applied independently of both the scan enable signal and the at least one sequential circuit element, the bus scan enable signal is operable to control when the plurality of input terminals are used to receive the functional input signals, and to control when the plurality of output terminals are to provide the functional output signals, and to control when the plurality of output terminals are to provide the test data, wherein the use of bus scan enable signal is for implementing a timing analysis of the integrated circuit.

9. The integrated circuit as set forth in claim 8, wherein said first and second switching devices are selectively operable to switch between a first position effective to complete said functional circuit path between said input terminals and said output terminals, and a second position effective to complete said testing circuit between said input terminals and said output terminals path during a testing cycle.

10. The integrated circuit as set forth in claim 9, wherein said functional circuit path further includes at least one tristate device arranged to selectively drive at least one signal line, said integrated circuit further including a signal generating device for generating a disable signal, said disable signal being effectively applied to said tristate device to selectively disable said tristate device during said testing signal propagation.

11. The integrated circuit as set forth in claim 8, wherein said second switching device is selectively operable to connect said output terminal of said sequential circuit element to a shared output terminal of said integrated circuit, said shared output terminal being arranged to be selectively connected to provide an output signal from said functional circuit path and from said testing circuit path.

12. The integrated circuit as set forth in claim 9, wherein said second switching device is selectively operable to connect said output terminal of said sequential circuit element to a shared output terminal of said integrated circuit, said shared output terminal being arranged to be selectively connected to provide an output signal from said functional circuit path and from said testing circuit path.

13. The integrated circuit as set forth in claim 10, wherein said second switching device is selectively operable to connect said output terminal of said sequential circuit element to a shared output terminal of said integrated circuit, said shared output terminal being arranged to be selectively connected to provide an output signal from said functional circuit path and from said testing circuit path.

14. The integrated circuit as set forth in claim 13, wherein said shared output terminal is a bidirectional terminal for providing an input signal to said functional circuit path.

15. The integrated circuit as set forth in claim 8, wherein said first switching device is a multiplexer, said multiplexer circuit being arranged to selectively connect said sequential circuit element into said functional circuit path or said testing circuit path.

16. The integrated circuit as set forth in claim 8, wherein said second switching device is a multiplexer, said multiplexer circuit being arranged to selectively connect said sequential circuit element into said functional circuit path or said testing circuit path.

17. The integrated circuit as set forth in claim 15, wherein said second switching device is a multiplexer, said multiplexer circuit being arranged to selectively connect said sequential circuit element into said functional circuit path or said testing circuit path.

18. The integrated circuit as set forth in claim 8, wherein said integrated circuit includes a plurality of sequential circuit elements, said integrated circuit further including a like plurality of each of said first and second switching devices connected to said sequential circuit elements.

19. The integrated circuit as set forth in claim 8, wherein said testing signal circuitry further includes a head register device connected between said one of said input terminals and said input terminal of said sequential element.

20. The integrated circuit as set forth in claim 19, wherein said head register device is comprised of at least one head register sequential logic device.

21. The integrated circuit as set forth in claim 20, wherein said head register sequential logic device is comprised of at least one flip-flop circuit.

22. The integrated circuit as set forth in claim 19, wherein said testing signal circuitry further includes a tail register device connected at an end of the testing circuit path for adding delay time for the testing circuit path.

* * * * *